US009530250B2

(12) United States Patent
Mazula

(10) Patent No.: US 9,530,250 B2
(45) Date of Patent: Dec. 27, 2016

(54) AUGMENTED REALITY UPDATING OF 3D CAD MODELS

(71) Applicant: Dassault Systemes, Velizy Villacoublay (FR)

(72) Inventor: Nelia Gloria Mazula, Houston, TX (US)

(73) Assignee: Dassault Systemes, Velizy Villacoublay (FR)

( * ) Notice: Subject to any disclaimer, the term of this patent is extended or adjusted under 35 U.S.C. 154(b) by 184 days.

(21) Appl. No.: 14/101,923

(22) Filed: Dec. 10, 2013

(65) Prior Publication Data

US 2015/0161821 A1    Jun. 11, 2015

(51) Int. Cl.
  *G06T 19/00*  (2011.01)
  *G06F 17/50*  (2006.01)

(52) U.S. Cl.
  CPC ......... *G06T 19/006* (2013.01); *G06F 17/5004* (2013.01); *G06T 2215/16* (2013.01); *G06T 2219/2008* (2013.01)

(58) Field of Classification Search
  None
  See application file for complete search history.

(56) References Cited

U.S. PATENT DOCUMENTS

| 7,391,424 B2 * | 6/2008 | Lonsing | 345/633 |
|---|---|---|---|
| 2002/0107674 A1 * | 8/2002 | Bascle | G06F 3/011 703/1 |
| 2005/0102050 A1 * | 5/2005 | Richey | 700/97 |
| 2007/0182739 A1 * | 8/2007 | Platonov et al. | 345/427 |
| 2009/0010489 A1 * | 1/2009 | Appel et al. | 382/100 |
| 2009/0216438 A1 * | 8/2009 | Shafer | 701/210 |
| 2009/0319058 A1 * | 12/2009 | Rovaglio et al. | 700/17 |
| 2010/0214284 A1 * | 8/2010 | Rieffel et al. | 345/419 |
| 2012/0116728 A1 * | 5/2012 | Shear | G06F 17/50 703/1 |
| 2014/0146038 A1 * | 5/2014 | Kangas et al. | 345/419 |
| 2014/0210947 A1 * | 7/2014 | Finn et al. | 348/46 |

OTHER PUBLICATIONS

Shen, Yan, Soh-Khim Ong, and Andrew YC Nee. "Collaborative design in 3D space." Proceedings of The 7th ACM SIGGRAPH International Conference on Virtual-Reality Continuum and Its Applications in Industry. ACM, 2008.*

Doil, F., et al. "Augmented reality for manufacturing planning." Proceedings of the workshop on Virtual environments 2003. ACM, 2003.*

(Continued)

*Primary Examiner* — Ryan M Gray
(74) *Attorney, Agent, or Firm* — Hamilton, Brook, Smith & Reynolds, P.C.

(57) ABSTRACT

A system and method updates Computer Aided Design (CAD) models. An augmented reality view of a subject asset is displayed. User interaction therewith causes a CAD model updater to search a CAD database for corresponding CAD model of the subject asset. The CAD model updater displays the CAD model view of the subject asset overlayed on the augmented reality view. With the mashed-up display of these two views, the CAD model updater enables user interaction therewith to update the corresponding CAD model. The updates to the CAD model are made to the CAD file of the model's originating CAD modeling application.

19 Claims, 4 Drawing Sheets

(56) References Cited

OTHER PUBLICATIONS

European Search Report issued in European Application No. EP/14195720.9, entitled "Augmented Reality Updating of 3D CAD Models," Date of Search: Sep. 24, 2015.
Close, Benjamin, et al., "Late Breaking Results: ARPipes: Aligning Virtual Models to their Physical Counterparts with Spatial Augmented Reality," 20$^{th}$ International Conference on Artificial Reality and Telexistence, Dec. 12, 2010, pp. 226-227, XP002744970.
Gimeno, Jesús, et al., "An Augmented Reality (AR) CAD System at Construction Sites," Dec. 9, 2011, pp. 15-33, XP002744971.
Shin, Do Hyoung, et al., "View Changes in Augmented Reality Computer-Aided-Drawing," *ACM Transactions on Applied Perceptions*, vol. 2, No. 1, Jan. 2005, pp. 1-14, XP002744972.

\* cited by examiner

AUGMENTED REALITY UPDATING OF 3D CAD MODELS

BACKGROUND OF THE INVENTION

Computer-aided techniques are known to include Computer-Aided Design or CAD, which relates to software solutions for authoring product design. Similarly, CAE is an acronym for Computer-Aided Engineering, e.g., it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional or 3D models of objects or assemblies of objects. CAD systems thus provide a representation of modeled objects using edges or lines, in certain cases with faces. Lines or edges may be represented in various manners, e.g., non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects; the typical size of a file representing an object in a CAD system being in the range of one Megabyte per part, and an assembly may comprise thousands of parts. A CAD system manages models of objects, which are stored in electronic files.

The current process facility asset (i.e., plant, production facility, refinery, etc.) is complex and continuously changing due to plant modifications. Often, since the plant is very large, the minor modifications are done in lower cost 2D CAD which is not compatible with the 3D CAD application used to design the plant or in a different 3D CAD application from the originating 3D CAD application type. After many changes to the facility the originating 3D CAD model is rendered obsolete. As a result, for major modifications and expansions, companies are forced to have a laser scan of the facility to get an as-is view of the plant. The laser scan however is not a CAD application and requires additional services and costs to re-engineer the areas of interest into a CAD model. The final result is a variety of files and versions of the plant with no comprehensive up to date 3D view of the facility.

SUMMARY OF THE INVENTION

Existing solutions do not combine modifications in a single view of the facility in a cost effective and efficient manner, nor do they offer to the user low cost and time-efficient alternatives to upload component modifications to a common platform for ongoing utilization. Laser scans may cost companies millions of dollars and are not interactive views of the facility. For minor plant modifications, laser scans do not offer a practical solution to the problem. Typically companies still have to re-engineer the point cloud into a CAD model/3D view. Even in scenarios where the CAD model is re-engineered there is no technology that allows the user to look at several CAD or interactive CAD based 3D images over the laser scan or other similar views such as smart videos in an intelligent manner.

Embodiments provide a computer-aided design (CAD) modeling method. The inventive method obtains an augmented reality view of a facility. The facility has various objects displayed in the augmented reality view. In response to user interaction with one of the facility objects as displayed in the augmented reality view, the method searches a CAD database for a corresponding CAD model of the one object. The CAD database stores a CAD model of the facility from a CAD modeling system. The search of the CAD database results in obtaining the CAD model of the facility that contains the corresponding CAD model of the one object.

Embodiments next display the database retrieved CAD model view of the one facility object overlaid on the augmented reality view of the one facility object. The overlay display is in a mashed up and aligned manner such that the original and retrieved from the CAD database CAD model view is displayed contemporaneously and contiguously to the augmented reality view. As a result, the user display interface is one view of the graphical data where the CAD object is on or within the augmented reality environment in the same or appearing to be the same location as the object in its augmented reality view such that the augmented reality looks like a background or back drop for the CAD object but both layers or environments are user interactive. Embodiments enable user interaction with this overlaid (in augmented reality) displayed CAD model view to update the CAD model of the facility in the CAD modeling system.

In various embodiments, the facility is a plant, factory, refinery, city or other asset or entity.

In embodiments, the augmented reality view is generated from a laser scan, a video or other imaging mechanism that is different from the original 3D CAD modeling system. In embodiments, display of the augmented reality view and user interaction therewith are implemented by an augmented reality application. The CAD database may be external to the augmented reality application in some embodiments, and in other embodiments the CAD database is internal or embedded in the subject application.

Further embodiments federate the CAD modeling system with the augmented reality application.

Embodiments enable user interaction with the displayed 3D CAD model view by the CAD modeling system that was originally used to generate the 3D CAD model of the facility and/or that was used to store said 3D CAD model in the CAD database.

Further in embodiments, in response to user interaction with the displayed CAD model view, the CAD modeling system updates the corresponding CAD model of the object and the CAD model to the facility in the CAD database.

The display of the CAD model view of the one facility object overlaying the augmented reality view is aligned in size, dimensions and orientation.

Computer systems for updating computer-aided design models of the present invention employ or implement the foregoing methods. In one embodiment a processor provides an augmented reality view of a facility. The augmented reality view displays objects of the facility, and the processor provides a user interface to the augmented reality view. A CAD model update engine is operatively coupled to the processor. The CAD model update engine is responsive to user interaction with the augmented reality view. In response to user interaction with one of the displayed facility objects, the CAD model update engine searches a CAD database for a corresponding CAD model of the one facility object, wherein the CAD database stores a CAD model of the facility from a CAD modeling system. The CAD model update engine obtains from the search of the CAD database, the CAD model of the facility containing the corresponding CAD model of the one facility object.

A display member is coupled to the processor and the CAD model update engine. The display member displays a CAD model view of the one facility object overlaying on the augmented reality view of the one facility object in an aligned manner. In this way, the CAD model view is displayed contemporaneously and contiguously to the augmented reality view while a user interacts with the CAD model view to update the 3D CAD model of the facility in the CAD modeling system.

In other embodiments, a computer program product updates computer-aided design (CAD) models, according to the foregoing methods and processes. In particular, a non-transitory computer readable medium embodies computer program code that updates 3D CAD models in a CAD database. The computer program code when executed by a computer implements the above tasks, features and designs of the present invention.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
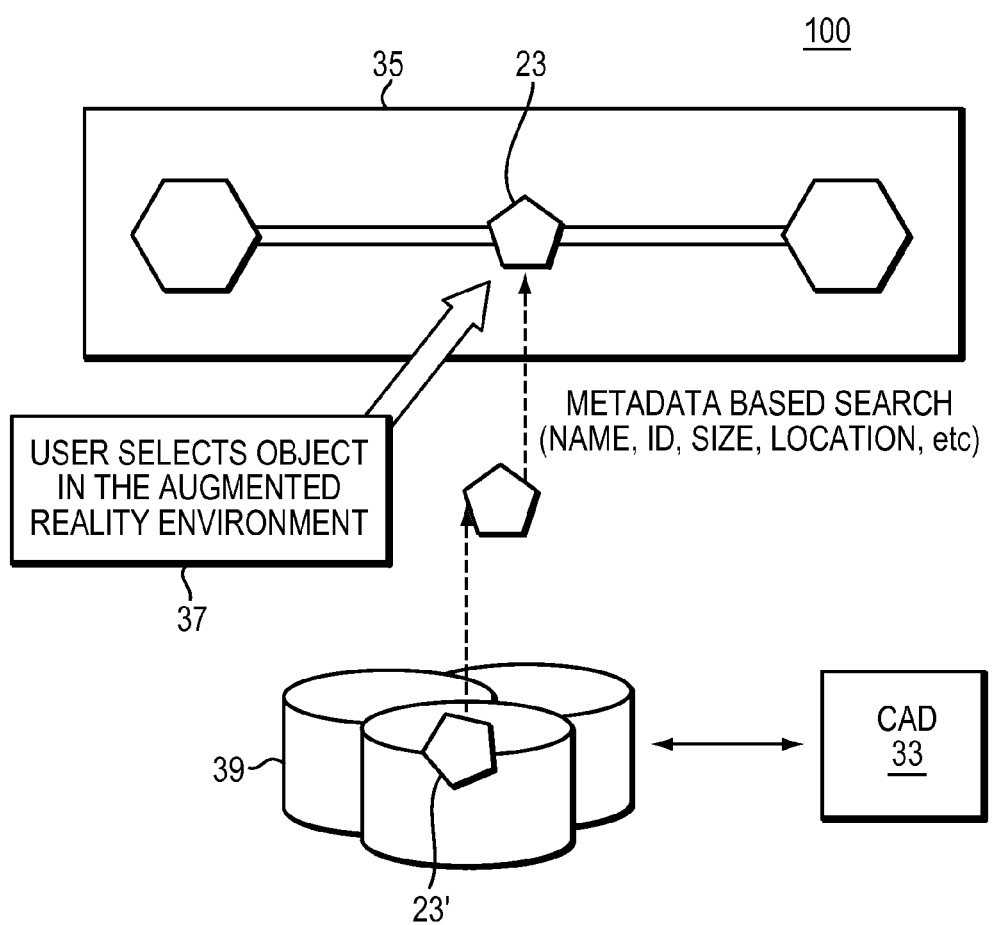
FIG. 1 is a schematic view of an embodiment of the present invention.

A description of example embodiments of the invention follows.

The problem that the industry is trying to resolve is how to keep an engineered design model up to date to improve facilities engineering decision support. Most updates are done in a modular way on a 2D or 3D image solution without updating the original larger facilities view or model. Laser scanning (to produce scan images) of the facility does not provide a CAD model solution to resolve this problem and still requires re-engineering of the specific modules (objects, parts, components, assemblies, etc.) or areas of interest.

Illustrated in FIGS. 1-4 are embodiments 100 (CAD model update engine and system) of the present invention. A CAD 3D modeling system 33 enables a user to create and store 3D models of real-world objects (e.g., vehicles, machines, factories, etc.). A database 39 stores the 3D models and metadata associated therewith. The database 39 may store other 3D modular views and images. In the current example, database 39 stores a 3D CAD model of a plant facility such as a refinery with one or more building structures having various component parts, assemblies, sub-assemblies and the like all detailed in CAD views and images. Database 39 stores the plant CAD model metadata including metadata of various objects 23' of the component parts, assemblies, etc. Metadata related to object 23' is stored in database 39 and may include object name, part ID number, location, size (dimensions) and the like.

An augmented reality system 37 generates augmented reality views 35 and provides a user interface supporting user interactions with the augmented reality views 35. When a user (using the augmented reality user interface of 37) selects an object 23 displayed in the augmented reality view 35, the invention system 100 queries database 39 for the object 23. That is, system 100 conducts a metadata search using object 23 metadata (e.g., name, ID, location, or size, etc.) from the augmented reality domain 35, 37 to find any corresponding object 23' in database 39 having matching metadata (e.g., object name, ID, location, or size information in database 39 stored metadata). From the results of the search, system 100 retrieves the CAD model view/images of corresponding object 23' from database 39.

In the illustrated example, invention system/CAD model update engine 100 uses location, name, ID, size and/or shape meta information to mash-up (index, cross reference or otherwise correspond) equipment components (including modifications) in engineering CAD models/images to a comprehensive view of the plant/refinery/asset in a laser scan or augmented reality view 35 of the facility. The comprehensive view 35 can be a laser scan or it can also be in other forms such as augmented reality, smart videos or even 3D CAD image/view of the plant. Overlapping the CAD model image/view of the object 23' (retrieved from CAD database 39) on the object 23 displayed in augmented reality view 35 is based on location information (geographic information in the comprehensive augmented reality view 35 of the facility). Location information may be a mix of XYZ coordinate and latitude/longitude information mapped or contained in the augment reality view 35 (and in some embodiments is also contained in the CAD data files stored in CAD database 39). Thus, the CAD model update engine/system 100 executes at least two actions in response to the user selecting the object 23 in augmented reality view 35: 1) a search of the component database 39 supporting the CAD model; and 2) a map of the component object 23' view (CAD model image) to the correct location of the object 23 in the augmented reality view 35.

Once the system 100 has overlaid (and visually coupled the corresponding objects 23, 23' in) the two views (original CAD view and current augmented reality view 35), the user can interact with the component CAD view of the data with the mashed up view as an interactive simulation (i.e. composer). Through this interaction (while contiguously viewing in the augmented reality domain 35, 37), the user can make modifications to CAD component data stored in CAD database 39. The user can open other views in the same augmented reality environment.

In this way, the invention CAD model updater/system 100 enables combining modifications in a single view of the facility in a cost effective and efficient manner in order to offer users a low cost and time-efficient way to upload component modifications to CAD models (as stored in database 39).

Embodiments 100 employ a metadata-based algorithm to search for component or equipment objects 23' in an external location (CAD database 39) from the augmented reality application 37. Embodiments 100, use a federated integration to search objects stored in a file, application, folder, database or similar 39 external to the augmented reality application 37. The technology (engine/system 100) leverages information in the augmented reality view 35 such as distance, XYZ or three-dimensional space location, and latitude/longitude as well as metadata mapping of physical (or other) aspects of equipment objects such as size, shape, name and ID. The user can interact with objects 23 in the augmented reality view 35 as a viewer or even modify the corresponding objects 23' in a design environment (CAD modeler 33) through the interaction with the overlaid CAD view images mashed-up with the augmented reality view 35. Since the technology is federated, all changes are actually made to the CAD file in its originating application (3D CAD modeling application 33).

Figure 2:
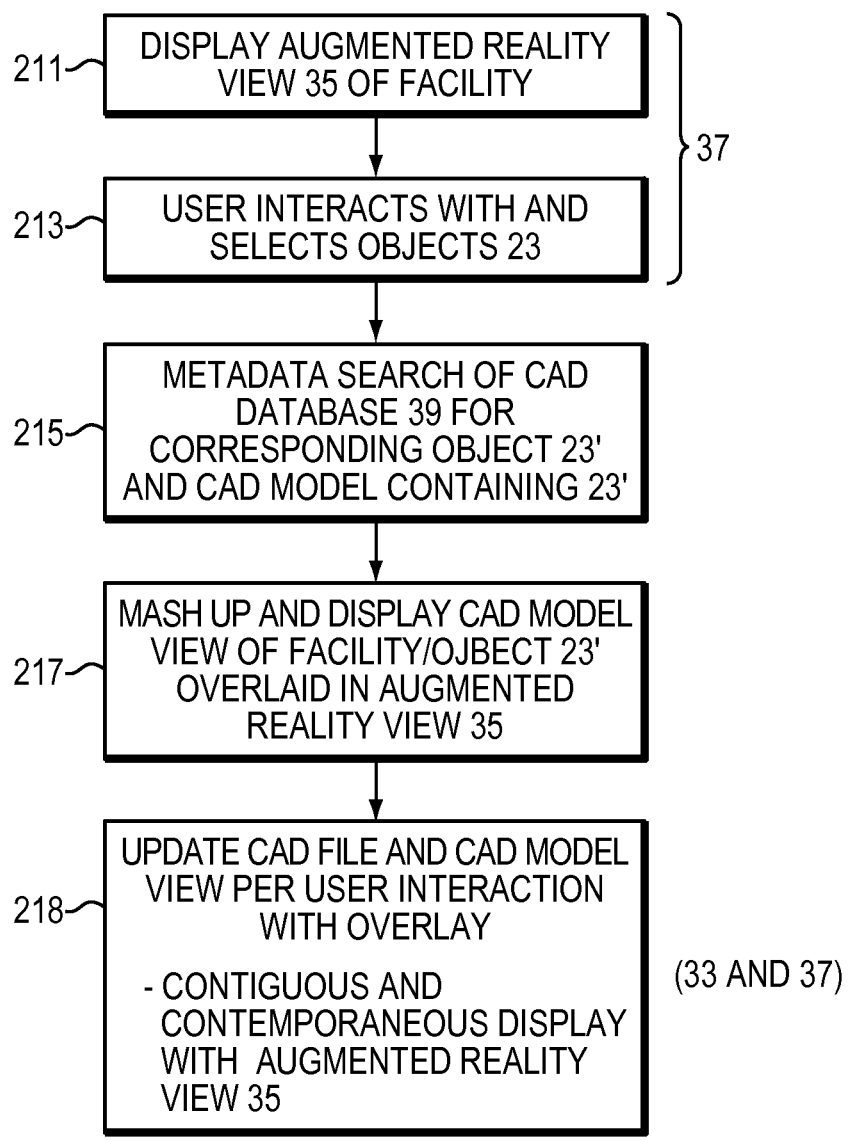
FIG. 2 is a flow diagram of an embodiment.

Referring to FIG. 2, flow of data and control of embodiments 100 are as follows. An augmented reality environment 37 (step 211) displays to a user an augmented reality view 35 of a subject facility/plant or the like. Using the augmented reality environment 37 user interface, step 213 allows the user to interact with the component parts and objects 23 displayed in the augmented reality view 35.

For a user selected object 23, system 100 (step 215) responsively obtains from the augmented reality view 35 and environment 37 object metadata such as name, ID, location, size, etc. Using this data, step 215 searches metadata of CAD files, CAD models and 3D images in database 39 for any corresponding object 23' having at least one matching piece of metadata, for example object name or ID. From the search results, step 217 obtains not only corresponding CAD object 23' but also the CAD model (data and images from the originating CAD application 33) of the facility containing object 23'. Step 217 thus aligns (scales, dimensions, orients, angles, etc.) and mashes-up the CAD model views of the facility with that of the augmented reality (e.g., object 23' by object 23). As a result, step 217 displays the corresponding CAD object 23' and its CAD model view of the subject facility overlaid in the augmented reality view 35 for user interaction therewith.

In turn, step 218 activates or otherwise engages CAD modeling system 33 to be responsive to user interactions in the mashed-up (overlaid) augmented reality view 35 of step 217. Specifically, as the user modifies data in the overlaying CAD model view portions of the facility to better match current image scans of the augmented reality view 35, CAD modeling system 33 updates the respective CAD files as pertinent. To support this user interaction, step 218 drives a display member to contemporaneously and contiguously display the two views, i.e., the CAD model view of the facility/corresponding object 23' overlaying the augmented reality view of the subject facility/object 23. In step 218, CAD modeling system (application) 33 is federated with augmented reality application 37.

Figure 3:
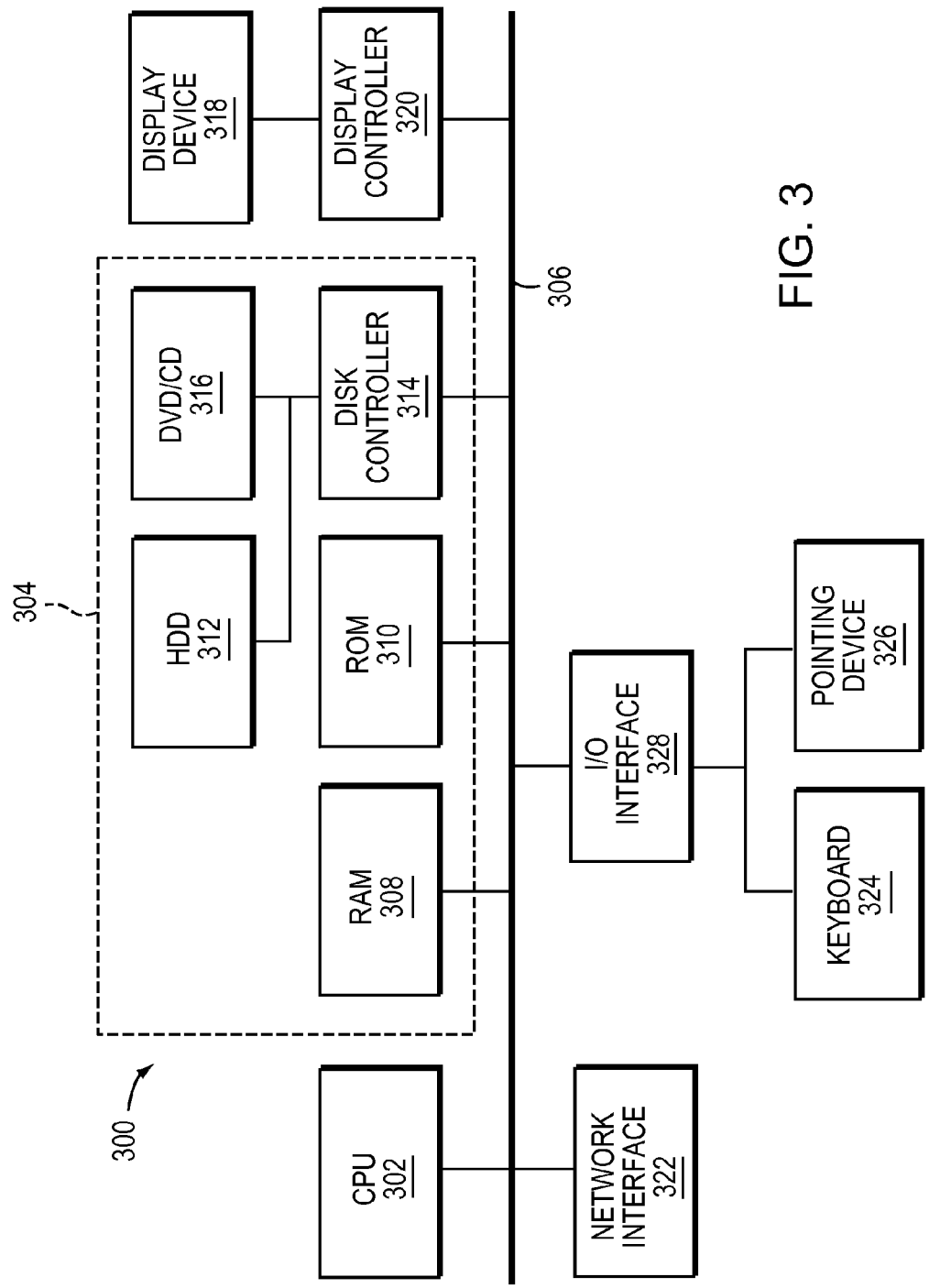
FIG. 3 is a block diagram of a computer system embodying the present invention.

FIG. 3 is a schematic block diagram of an exemplary computer-aided design station 300, which may also be referred to herein as a computer system. As used herein, the terms "computer-aided design station" and "computer system" refer generally to any suitable computing device that may be used to perform the processes described above and/or any additional processes that may be related to those described above.

In an exemplary embodiment, the computer-aided design station 300 includes one or more processors 302 (CPU) that performs the processes described above in FIGS. 1 and 2 and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a non-transitory computer-readable medium, such as a memory area 304 that is operably and/or communicatively coupled to the processor 302 by a system bus 306. A "memory area," as used herein, refers generally to any means of storing program code and instructions executable by one or more processors to aid in automatically updating CAD models using an augmented reality tool. The memory area 304 may include one, or more than one, forms of memory. For example, the memory area 304 may include random-access memory (RAM) 308, which can include non-volatile RAM, magnetic RAM, ferroelectric RAM, and/or other forms of RAM. The memory area 304 may also include read-only memory (ROM) 310 and/or flash memory and/or electrically-erasable programmable read-only memory (EEPROM). Any other suitable magnetic, optical, and/or semiconductor memory, such as a hard-disk drive (HDD) 312, by itself or in combination with other forms of memory, may be included in the memory area 304. HDD 312 may also be coupled to a disk controller 314 for use in transmitting and receiving messages to and from processor 302. Moreover, the memory area 304 may also be, or may include, a detachable or removable memory 316, such as a suitable cartridge disk, CD-ROM, DVD, or USB memory. The above examples are exemplary only and, thus, are not intended to limit in any way the definition and/or meaning of the term "memory area."

The computer-aided design station 300 also includes a display device 318 that is coupled, such as operably coupled, to a display controller 320. The display controller 320 receives data via the system bus 306 for display by the display device 318. The display device 318 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 318 may include a touchscreen with an associated touchscreen controller. The above examples are exemplary only and, thus, are not intended to limit in any way the definition and/or meaning of the term "display device."

In addition, the computer-aided design station 300 includes a network interface 322 for use in communicating with a network (not shown in FIG. 3). Moreover, the computer-aided design station 300 includes one or more input devices, such as a keyboard 324 and/or a pointing device 326, such as a roller ball, mouse, touchpad, and the like. The input devices are coupled to and controlled by an input/output (I/O) interface 328, which is further coupled to the system bus 306.

A description of the general features and functionality of the display device 318, keyboard 324, pointing device 326, as well as the display controller 320, disk controller 314, network interface 322, and I/O interface 328 is omitted herein for brevity as these features are known.

Figure 4:
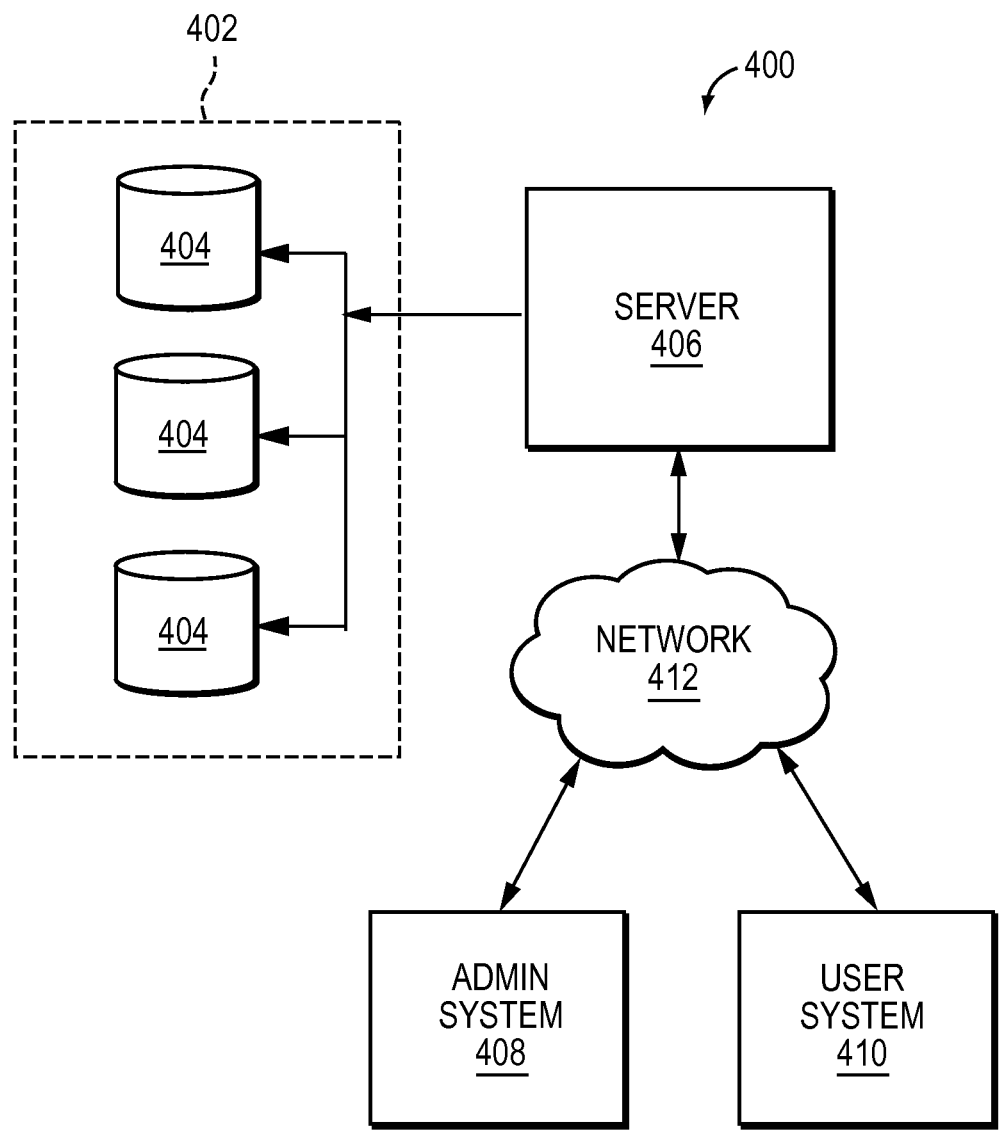
FIG. 4 is a schematic illustration of a computer network employing the computer system of FIG. 3.

FIG. 4 is a schematic block diagram of an exemplary system 400 for use in updating computer-aided design of a modeled object, such as the processes described above and/or additional processes that may be related to those described above. In an exemplary embodiment, a memory area 402 includes one or more storage devices 404 for use in storing CAD data, such as modeled object data, and augmented reality data, and/or positioning data related to augmented reality objects. In some embodiments, the memory area 402 is coupled to a server 406, which is in turn coupled to an administrator system 408 and/or a user system 410 via a network 412. The storage devices 404 may be embodied as one or more databases, may be located at a single or at multiple geographical sites, or may be integrated with the server 406.

As can be appreciated, the network 412 can be a public network, such as the Internet, or a private network such as an LAN or WAN network, or any combination thereof and can also include PSTN or ISDN sub-networks. The network 412 can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network 412 is merely exemplary and in no way limits the scope of the present advancements.

As one of ordinary skill in the art would recognize, the administrator system 408 and/or the user system 410 can be a computer-aided design station such as the one described above with reference to FIG. 3, or any other computing system that is known. Moreover, it should be understood that the administrator system 408 and/or the user system 410 are configured to perform the processes described above and/or any additional processes that may be related to those described above.

The server 406 stores the computer-readable instructions to execute the processes described above and provides these instructions via the network 412 to the administrator system 408 and/or the user system 410. Moreover, the server 406 can also provide data from the memory area 402 as needed to the administrator system 408 and the user system 410. As such, FIG. 4 includes implementations of the system 400 via cloud computing, distributed computing and the like.

Exemplary embodiments of systems, methods, apparatus, computer program products, and computer-readable storage media for use in computer-aided design of a modeled object are described above in detail. The systems, methods, apparatus, computer program products, and computer-readable storage media are not limited to the specific embodiments described herein but, rather, operations of the methods, program products and/or storage media, as well as components of the system and/or apparatus, may be utilized independently and separately from other operations and/or components described herein. Further, the described operations and/or components may also be defined in, or used in combination with, other systems, methods, apparatus, program products and/or storage media, and are not limited to practice with only the systems, methods, apparatus, program products and storage media as described herein.

A computer or computer system, such as those described herein, includes at least one processor or processing unit and a system memory. The computer or computer system typically has at least some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Exemplary non-transitory computer-executable components for use in the processes described above include, but are not limited to only including, a display component that causes the processor 302 (shown in FIG. 3) to present a modeled object 23' overlaid in augmented reality viewing area 35 of a display device 318 (shown in FIG. 3). The components also include an interface component that causes the processor 302 to receive user inputs via, for example, the I/O interface 328 (shown in FIG. 3). As described above, the user inputs may be related to use of federated CAD software to update the CAD modeled object 23', creating a CAD model view overlaying augmented reality view 35, creating an instance of a 3D model/CAD updating tool 100 (shown in FIGS. 1-2), and/or to automatically search, retrieve and position (align) CAD modeled objects 23' with respect to laser scan image objects 23 in user-interactive augmented reality view 35.

Moreover, the components include a 3D CAD model update component that causes the processor 302 to perform the steps described and shown in FIG. 2 above. The 3D CAD model update component displays a CAD model view (retrieved from a CAD database) of the subject asset overlayed on the augmented reality view. With the mashed-up display of these two views, the CAD model update component enables user interaction therewith to update the corresponding CAD model. The updates to the CAD model are made to the CAD file of the model's originating CAD modeling application for example.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of well known computer systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

For example, although the foregoing describes application of embodiments to facilities and production/manufacturing plants, the principles of the present invention applies to cities, multi-asset groupings and other entities.

What is claimed is:

1. A computer aided design (CAD) modeling method comprising:
   obtaining an augmented reality view of a facility, the facility having various objects displayed in the obtained augmented reality view, the various displayed objects having interactive capability in the obtained augmented reality view;
   in response to user selection of a particular facility object of one of the facility objects as displayed in the obtained augmented reality view of the facility, searching a CAD database for a CAD model of the one object having metadata matching metadata of the particular facility object, the CAD database storing a CAD model of the facility from a CAD modeling system, and said searching resulting in obtaining the CAD model of the facility that contains the corresponding CAD model of the one object;
   displaying a CAD model view of the one facility object overlaying on the augmented reality view of the one facility object in a mashed-up and aligned manner such that the CAD model view of the one facility object is displayed contemporaneously and contiguously to the obtained augmented reality view of the facility; and
   enabling user interaction with the displayed CAD model view of the one facility object to update the CAD model of the facility in the CAD modeling system.

2. A method as claimed in claim 1 wherein the facility is a plant, factory, refinery, city, entity or other asset.

3. A method as claimed in claim 1 further comprising generating the augmented reality view from a laser scan, a video or other imaging mechanism.

4. A method as claimed in claim 1 wherein display of the augmented reality view and user interaction therewith are implemented by an augmented reality application; and
   the CAD database is one of external to or embedded in the augmented reality application.

5. A method as claimed in claim 4 further comprising federating the CAD models of the CAD database of the CAD modeling system with the augmented reality view of the augmented reality application.

6. A method as claimed in claim 1 wherein enabling user interaction with the displayed CAD model view is implemented by the CAD modeling system that was originally used to generate the CAD model of the facility and/or used to store said CAD model in the CAD database.

7. A method as claimed in claim 1, further comprising in response to user interaction with the displayed CAD model view, the CAD modeling system updating the corresponding CAD model of the object and the CAD model of the facility in the CAD database.

8. A method as claimed in claim 1 wherein displaying of the CAD model view of the one facility object overlaying the augmented reality view is aligned in size, dimensions and/or orientation.

9. A computer system for updating computer aided design (CAD) models, comprising:
   a processor configured to provide an augmented reality view of a facility, the provided augmented reality view displaying objects of the facility, the various displayed objects having interactive capability in the provided augmented reality view of the facility, and the processor providing a user interface to the provided augmented reality view of the facility;
   a CAD model update engine operatively coupled to the processor and responsive to user interaction with the provided augmented reality view of the facility, in response to user selection of a particular facility object of one of the displayed facility objects in the provided augmented reality view of the facility, the CAD model update engine configured to search a CAD database for a CAD model of the one facility object having metadata matching metadata of the particular facility object, wherein the CAD database stores a CAD model of the facility from a CAD modeling system,
   the CAD model update engine further configured to update, from the search of the CAD database, the CAD model of the facility containing the corresponding CAD model of the one facility object; and
   a display member coupled to the processor and the CAD model update engine, the display member configured to display a CAD model view of the one facility object overlaying on the augmented reality view of the one facility object in an aligned manner such that the CAD model view of the one facility object is displayed contemporaneously and contiguously to the provided augmented reality view of the facility while a user interacts with the CAD model view of the one facility object to update the CAD model of the facility in the CAD modeling system.

10. A computer system as claimed in claim 9 wherein the facility is a plant, factory, city, refinery, entity or other asset.

11. A computer system as claimed in claim 9 wherein the augmented reality view is generated from a laser scan, a video or other imaging mechanism.

12. A computer system as claimed in claim 9 wherein the processor is further configured to execute an augmented reality application to generate and display the augmented reality view of the facility and to provide the user interface to the augmented reality view; and
the CAD database is one of external to the augmented reality application or embedded with the augmented reality application.

13. A computer system as claimed in claim 12 wherein the CAD models of the CAD database of the CAD modeling system is federated with the augmented reality view of the augmented reality application.

14. A computer system as claimed in claim 9 wherein the CAD modeling system enables the user to interact with the CAD model view; and
the CAD model of the facility was originally generated through or stored in the CAD database by the CAD modeling system.

15. A computer system as claimed in claim 9 wherein in response to user interaction with the displayed CAD model view, the CAD modeling system is further configured to update the corresponding CAD model of the object and the CAD model of the facility in the CAD database.

16. A computer system as claimed in claim 9 wherein the CAD model update engine is further configured to align the CAD model view of the one facility object in size and orientation to the augmented reality view.

17. A computer system as claimed in claim 9 wherein the processor is further configured to execute the CAD model update engine.

18. A computer program product for updating Computer Aided Design (CAD) models, comprising:
a non-transitory computer readable medium embodying computer program code for updating CAD models in a CAD database,
the computer program code when executed by a computer causes:
obtaining an augmented reality view of an entity, the entity having various objects displayed in the augmented reality view, the various displayed entity objects having interactive capability in the obtained augmented reality view of the entity;
in response to user selection of a particular facility object of one of the entity objects as displayed in the obtained augmented reality view of the entity, searching the CAD database for a CAD model of the one object having metadata matching metadata of the particular facility object, the CAD database storing a CAD model of the entity from a CAD modeling system, and said searching resulting in obtaining the CAD model of the entity that contains the corresponding CAD model of the one object;
displaying a CAD model view of the one entity object overlaying on the augmented reality view of the one entity object in a mashed-up manner such that the CAD model view of the one entity object is displayed contemporaneously and contiguously to the obtained augmented reality view of the entity; and
enabling user interaction with the displayed CAD model view of the one entity object to update the CAD model of the entity in the CAD modeling system.

19. A computer program product as claimed in claim 18 wherein the entity is any of a facility, city, refinery, factory or other asset.

* * * * *